United States Patent
Li (10) Patent No.: US 7,480,144 B2
(45) Date of Patent: Jan. 20, 2009

(54) HEAT DISSIPATION DEVICE

(75) Inventor: Dong-Yun Li, Shenzhen (CN)

(73) Assignees: Fu Zhun Precision Industry (Shen Zhen) Co., Ltd., Shenzhen (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 95 days.

(21) Appl. No.: 11/556,566

(22) Filed: Nov. 3, 2006

(65) Prior Publication Data

US 2008/0106869 A1 May 8, 2008

(51) Int. Cl.
*H05K 7/20* (2006.01)
*H01L 23/36* (2006.01)

(52) U.S. Cl. .................. 361/704; 361/695; 361/697; 361/719; 165/80.3; 165/104.33; 165/104.34; 165/121

(58) Field of Classification Search .......... 361/687, 361/690–697, 704–710, 718–720, 736, 752; 257/706–727; 174/15.1, 15.2, 16.3, 252; 165/80.2, 80.3, 80.4, 104.33, 104.34, 121, 165/125, 185; 411/352, 353, 152, 153, 544; 24/500, 502, 544, 615, 625; 248/316.7, 505, 248/510

See application file for complete search history.

(56) References Cited

U.S. PATENT DOCUMENTS

| | | | |
|---|---|---|---|
| 6,407,919 B1 * | 6/2002 | Chou | 361/697 |
| 6,498,724 B1 * | 12/2002 | Chien | 361/687 |
| 6,795,317 B1 | 9/2004 | Liu | |
| 7,099,156 B2 * | 8/2006 | Chen et al. | 361/719 |
| 7,126,823 B2 * | 10/2006 | Chen et al. | 361/702 |
| 7,161,808 B2 * | 1/2007 | Atkinson | 361/719 |
| 7,180,743 B2 * | 2/2007 | Chen et al. | 361/704 |
| D561,120 S * | 2/2008 | Chen et al. | D13/179 |

* cited by examiner

*Primary Examiner*—Michael V Datskovskiy
(74) *Attorney, Agent, or Firm*—Frank R. Niranjan (57) ABSTRACT

A heat dissipation device includes a retention module (40) and a heat sink (10) both mounted on the printed circuit board (50). The retention module forms a pair of opposite fixture blocks (44) thereon. The heat sink received in the retention module has protective hollow sleeves (28) positioned corresponding to the blocks. Each sleeve has a supporting pad (286) therein. A pair of braces (32) each extend through the sleeve and comprise a baffle portion (321) located above the pad and a fastening portion (324) below a bottom end of the sleeve. A spring (33) is compressed between the baffle portion of the brace and the pad of each of the sleeves. The fastening portions of the braces securely fasten the blocks of the retention module after the first springs are stretched a distance with an upward movement of the braces.

19 Claims, 9 Drawing Sheets

HEAT DISSIPATION DEVICE

BACKGROUND OF THE INVENTION

1. Field of the Invention

The present invention relates generally to a heat dissipation device, and more particularly to a heat dissipation device with clips incorporating a retention module for securing the heat dissipation device to a heat generating electronic device.

2. Description of Related Art

It is well known that heat is produced during operation of electronic devices such as central processing units (CPUs). The heat produced must be quickly removed to ensure normal operation of the CPU. Thus heat sinks are commonly attached to CPUs to remove excess heat.

According to related art, a heat sink is often directly attached to a printed circuit board on which a CPU is mounted. The heat sink is attached to the printed circuit board using one or more screws. The screws are inserted from a back surface of the printed circuit board and are screwed into the heat sink positioned on a front surface of the printed circuit board. However, the using of the screws to hold the heat sink is a complex operation to perform on an assembly line as it requires accurate placement of the heat sink and screwing of multiple small screws into place. In addition, heat sinks of the related art are typically bulky, unwieldy, and completely prevent access to the CPU. Access to the CPU is repeatedly required, for example, for repair, testing, or replacement of the CPU. In many instances, very little space is present near the back surface of the printed circuit board. In such instances, the entire printed circuit board must be removed to gain access to the screws. Removing the entire printed circuit board is a time consuming task which is awkward and which costs money in wasted man-hours.

As an additional drawback, the screws used in related art systems do not always uniformly attach the heat sink to the CPU. That is, if all of the screws are not tightened to the same extent, the heat sink may not uniformly contact the surface of the CPU.

SUMMARY OF THE INVENTION

A heat dissipation device in accordance with a preferred embodiment of the present invention comprises a retention module, a heat sink, a fan holder and a pair of clips cooperating with the retention module to secure the heat sink to a heat-generating electronic element mounted on a printed circuit board. The retention module forms a pair of opposite fixture blocks at opposite lateral sides. The heat sink is received in the retention module. The fan holder is mounted on the heat sink and forms a pair of protective hollow sleeves positioned above the blocks of the retention module, respectively. Each sleeve has an inner surface therein and a supporting pad formed on the inner surface of the sleeve. A pair of braces each extends through the sleeve and comprises a baffle portion located above the pad and a fastening portion below a bottom end of the sleeve. A spring is compressed between the baffle portion of the brace and the pad of each sleeve. The fastening portion of the brace securely fastens a corresponding one of the blocks of the retention module after the spring is stretched a distance with an upward movement of the brace.

Other advantages and novel features of the present invention will become more apparent from the following detailed description when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
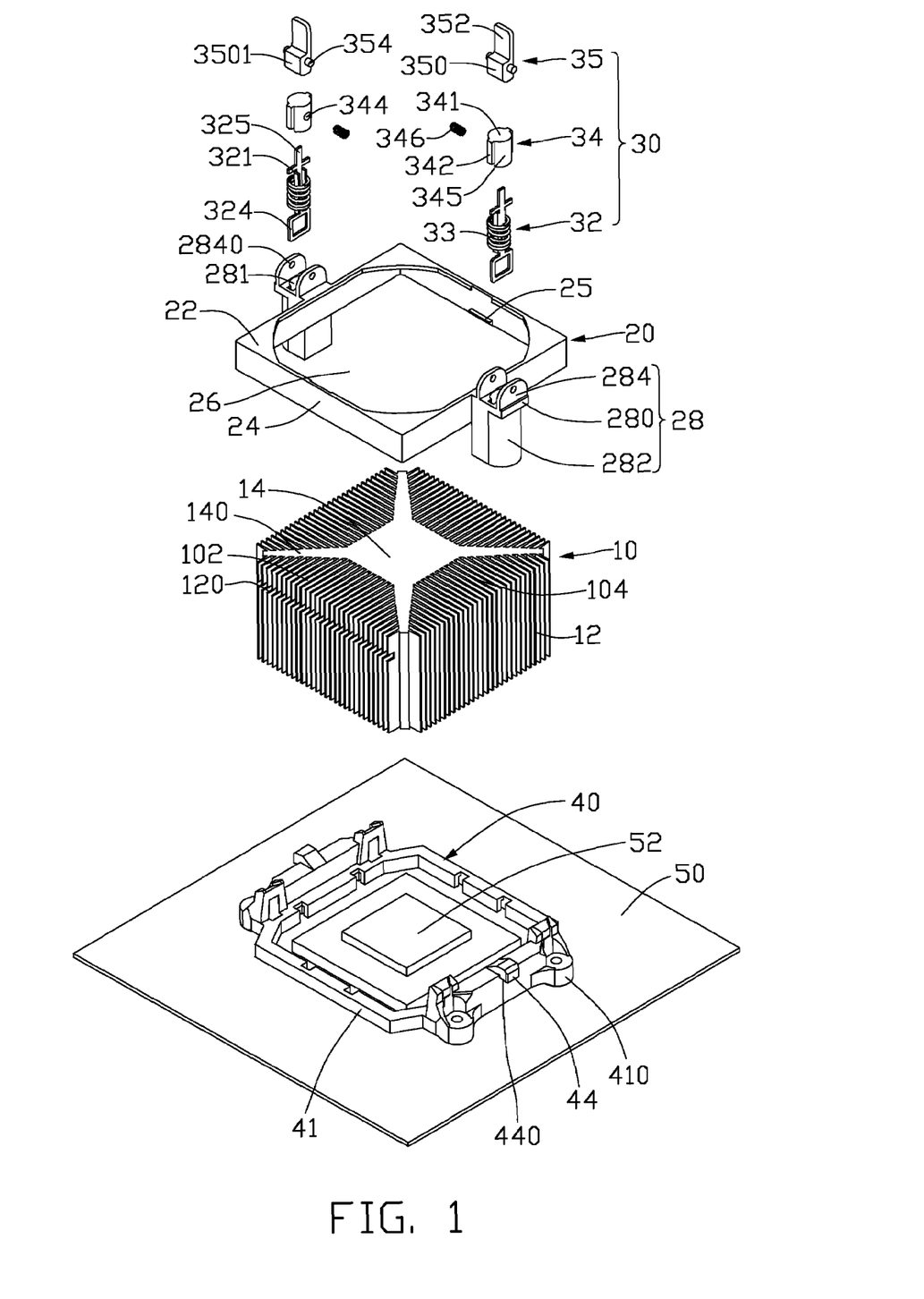
FIG. 1 is an exploded, isometric view of a heat dissipation device in accordance with a preferred embodiment of the present invention, wherein the heat dissipation device is mounted on a printed circuit board with a CPU thereon.

Referring to FIG. 1, a heat dissipation device in accordance with a preferred embodiment of the present invention comprises a heat sink 10, a retention module 40, a holder 20, a fan (not shown) mounted on the heat sink 10 via the holder 20 and a pair of clips 30 cooperating with the retention module 40 and the holder 20 to secure the heat sink 10 to a heat-generating electronic component such as a CPU 52 located on a printed circuit board 50 and surrounded by the retention module 40.

The retention module 40 is a substantially rectangular frame and comprises four interconnecting sidewalls 41 located around the CPU 52. The retention module 40 forms a post 410 at each of four corners thereof. Four screws (not shown) extend through the posts 410 to mount the retention module 40 on the printed circuit board 50. A pair of fixture blocks 44 are formed on a center of a pair of opposite lateral sidewalls 41. A corresponding portion of each block 44 extending beyond the corresponding lateral sidewall 41 forms a concave surface 440 at a bottom thereof.

The heat sink 10 comprises a solid core 14 shaped similar to a cube and four symmetrical branches 140 extending outwardly from four edges of the core 14. A plurality of fins 12 project outwardly from sides of the core 14 and the branches 140. The fins 12 can be divided into four groups each oriented towards a different direction. Four side surfaces of the core 14 and the four branches 140 form four regions consisting of a first pair of opposing fin groups 102 and a second pair of opposing fin groups 104. Each fin group 102, 104 of the fins 12 is formed at a corresponding region. Two neighboring fin groups 102, 104 of the fins 12 are oriented perpendicularly to each other. The fins 12 located in the first pair of regions 102 define recesses 120 at extremities of an upper portion thereof, for mounting the holder 20 on the heat sink 10.

The holder 20 has a square configuration, and comprises a mounting plate 22 and four sidewalls 24 extending downwardly from the mounting plate 22. A central opening 26 is defined in the mounting plate 22 for allowing passage of airflow generated by the fan towards the heat sink 10. A pair of opposite sidewalls 24 of the four sidewalls 24 form tongues 25 extending inwardly from a central bottom edge thereof for being engaged in the corresponding recesses 120 of the heat sink 10, thereby mounting the holder 20 onto the heat sink 10. Another pair of lateral sidewalls 24 of the four sidewalls 24 form protective hollow sleeves 28 thereon.

Figure 2:
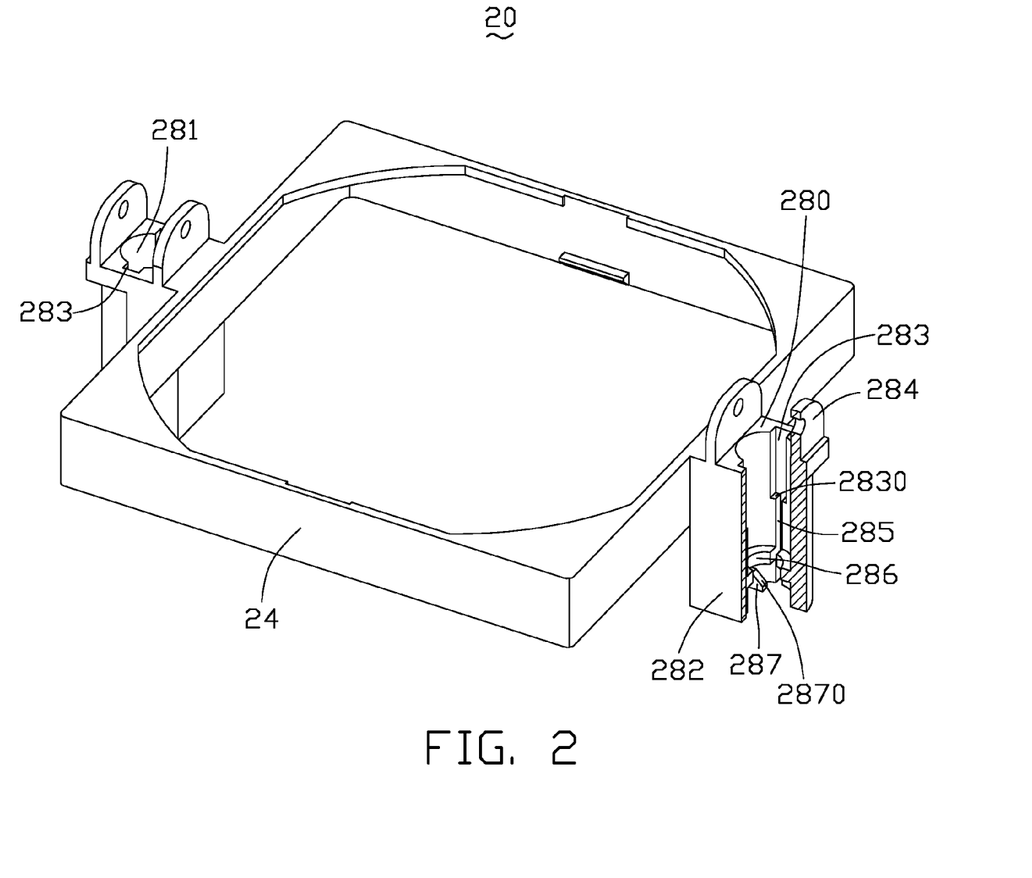
FIG. 2 is an enlarged, partly cut-away view of a holder of the heat dissipation device of FIG. 1.

Each of the sleeves 28 defines a round through hole 281 therein. The round through hole 281 is used for receiving the corresponding clip 30 therein. The sleeve 28 comprises a top plate 280 horizontally and outwardly extending from a top edge of the lateral sidewall 24 of the holder 20, and an outer wall 282 extending downwardly from the top plate 280. The top plate 280 is located at a center of the lateral sidewall 24 of the holder 20 and extends beyond the outer wall 282. A pair of spaced protruding ears 284 perpendicularly and upwardly extend from the top plate 280. A mounting hole 2840 is defined in each of the ears 284. The through hole 281 is defined through the top plate 280 of the sleeve 28 and surrounded by an inner surface (not labeled) of the outer wall 282. Referring to FIG. 2, a pair of opposite elongated slots 283 extend outwardly from the through hole 281 and communicate with the through hole 281. Each of the slots 283 has a rectangular cross section. The slot 283 defined in the sleeve 28 extends along a vertical direction, and terminates at a central portion of the inner surface of the sleeve 28. A split 285 extends from a bottom end of the slot 283 along the vertical direction and communicates with the corresponding slot 283. The split 285 terminates at a bottom end of the sleeve 28. An extending length of the split 285 is slightly longer than that of the slot 283 along the vertical direction. The slot 283 has a width along an extending direction of the lateral sidewalls 24 larger than that of the split 285 so that a step 2830 is formed at a joint of the slot 283 and the split 285. An annular pad 286 is circumferentially formed on the inner surface of the sleeve 28 and adjacent to the bottom end of the sleeve 28. The split 285 extends through the annular pad 286. A bulge 287 extends from an inner surface of the annular pad 286 adjacent to the lateral sidewall 24 of the holder 20. The bulge 287 has an inclined surface 2870.

Figure 3:
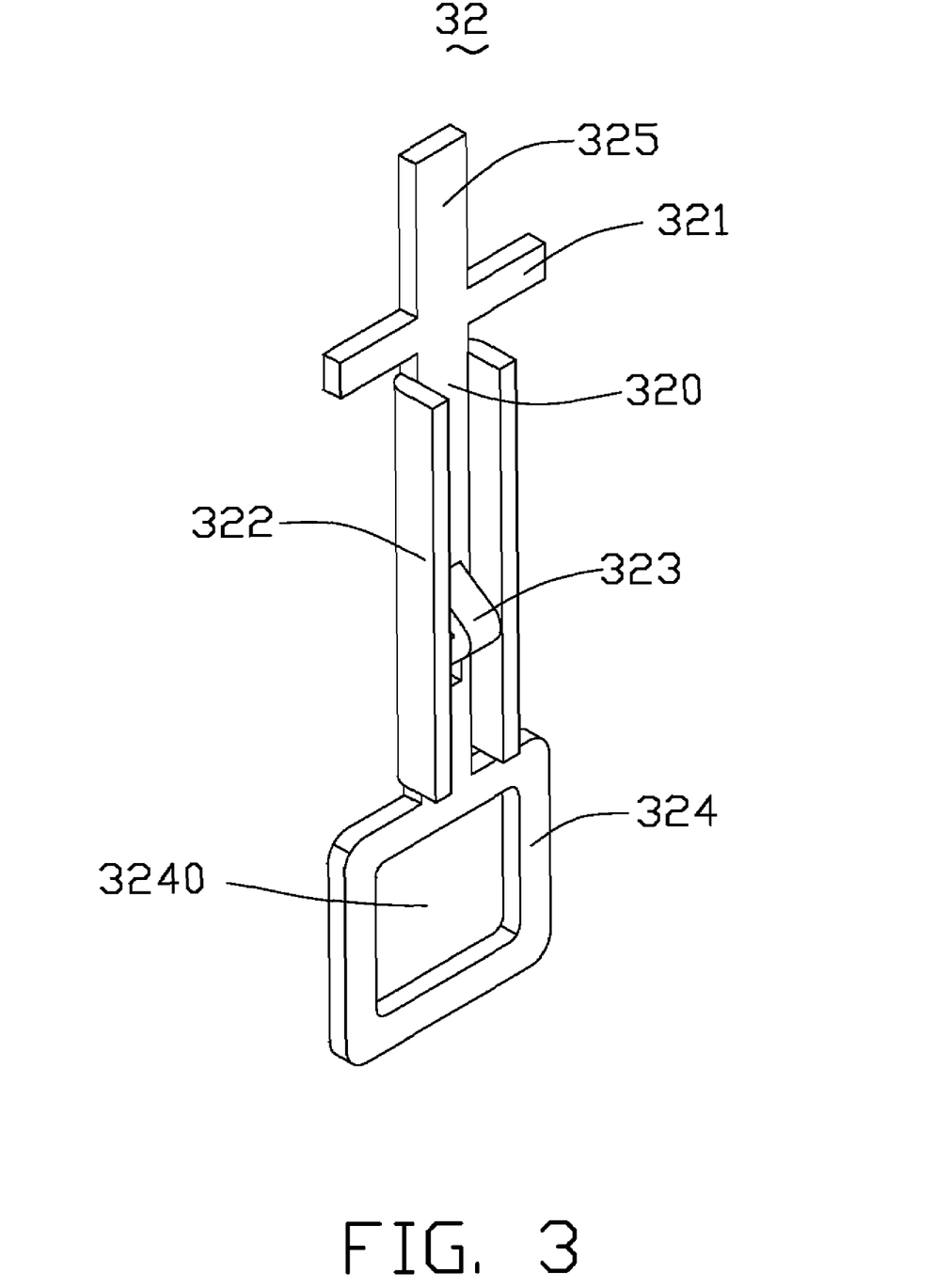
FIG. 3 is an enlarged view of a brace of a clip of the heat dissipation device of FIG. 1.

Referring to FIG. 1 again, each of the clips 30 comprises a metal supporting brace 32, a first compression spring 33 mounted around the brace 32, a guiding member 34 and an operating member 35. The supporting brace 32 with the first compression spring 33 and the guiding member 34 are used for being mounted in the sleeve 28 of the holder 20. Also referring to FIG. 3, the brace 32 comprises an upright post 320 with a transverse baffle portion 321 near a top of the upright post 320 and an insertion portion 325 formed above the transverse baffle portion 321 so that the brace 32 has a cross configuration near the top thereof. A pair of reinforce plates 322 extend perpendicularly from two opposite sides of the post 320 of the brace 32 and below the transverse baffle portion 321, for reinforcing the post 320 of the brace 32. A tab 323 is formed on the post 320 near a bottom end of the post 320, for engaging with the inclined surface 2870 of the bulge 287 of the sleeve 28 of the holder 20. A square fastening portion 324 is formed at the bottom end of the post 320. The fastening portion 324 can slide along the slots 283 and the splits 285 in the sleeve 28 through the through hole 281 of the sleeve 28 and reach beyond the bottom of the sleeve 28. The fastening portion 324 defines a square fixing hole 3240 therein corresponding to the block 44 of the retention module 40, for clasping the block 44. The first compression spring 33 mounted around the post 320 has a diameter which is smaller than an extending length of the transverse baffle portion 321. The first compression spring 33 is located between the transverse baffle portion 321 and the fastening portion 324.

Figure 4:
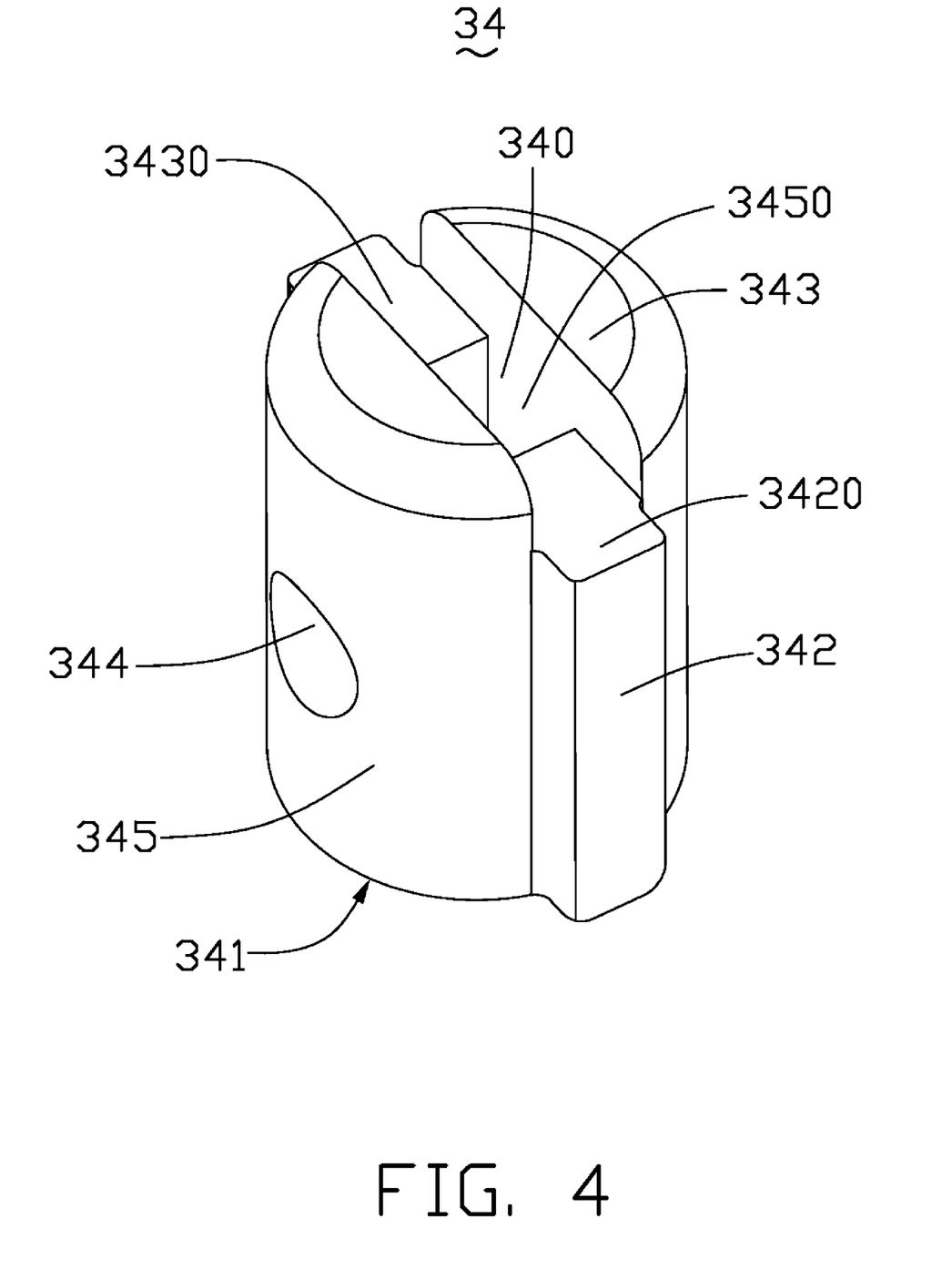
FIG. 4 is an enlarged view of a guiding member of the clip of the heat dissipation device of FIG. 1, but shown from a bottom aspect.
Figure 5:
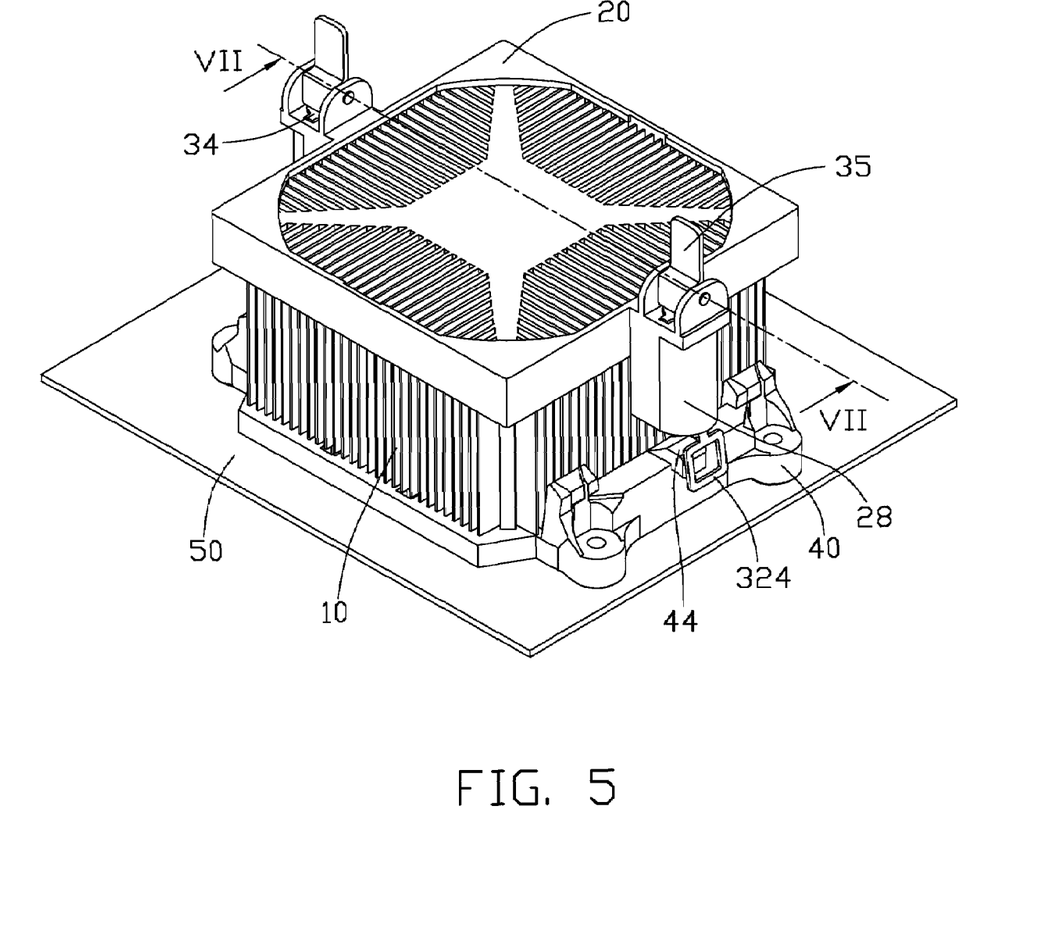
FIG. 5 is an assembled view of FIG. 1 with the clip in an unlocked position.
Figure 6:
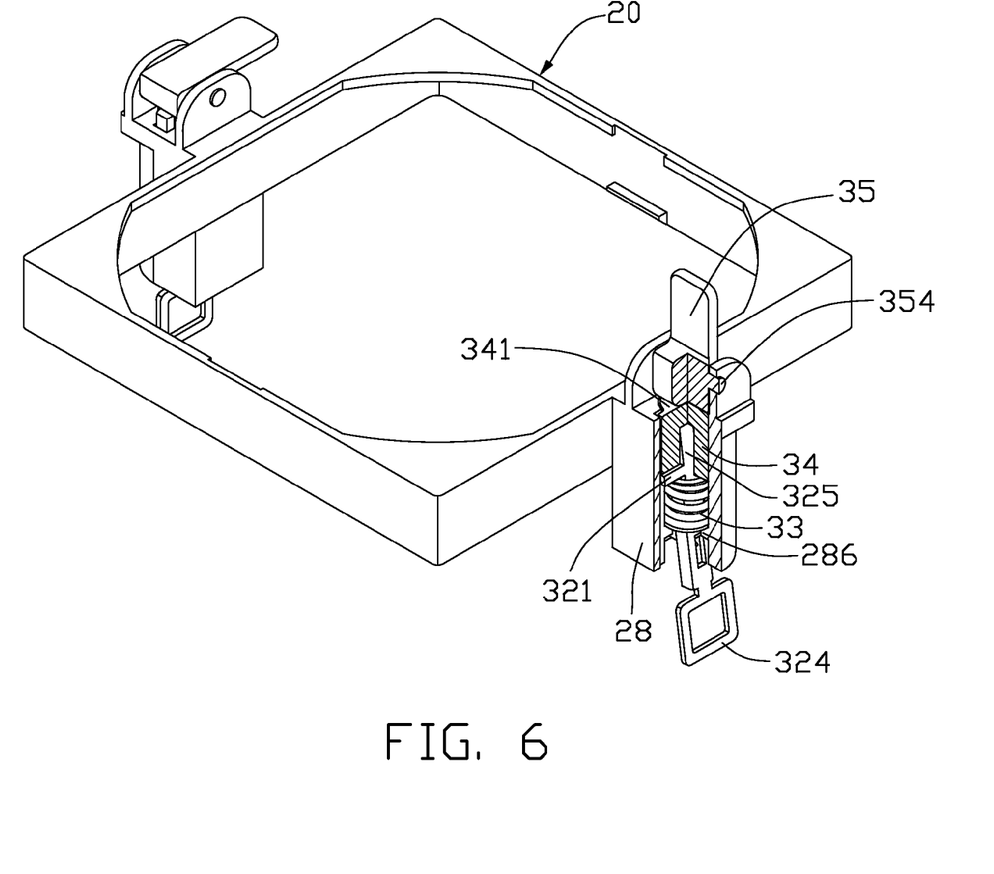
FIG. 6 is an assembled, partly cut-away view of the holder and the clip of the heat dissipation device of FIG. 1.

Referring to FIGS. 1 and 4, wherein FIG. 4 shows the guiding member 34 of the clip 30 from a bottom aspect. The guiding member 34 has a substantially cylindrical configuration. The guiding member 34 defines an elongated opening 340 therein having a bottom open end (not labeled) for providing passage of the insertion portion 325 of the brace 32. The guiding member 34 comprises a top portion 341, two opposite outer walls 345 extending from edges of the top portion 341 and a pair of protruding bars 342 vertically formed at a joint of the two outer walls 345. The outer walls 345 have determined thicknesses and two opposite plane surfaces 3450 surrounding the opening 340. The guiding member 34 defines a groove 3430 at a bottom portion 343 thereof. The protruding bars 342 terminate at the groove 3430 of the bottom portion 343 of the guiding member 34 along the vertical direction. The protruding bars 342 extend into the opening 340 of the guiding member 34 along a horizontal direction so that the opening 340 has a rectangular cross-section. The transverse baffle portion 321 of the brace 32 is received in the groove 3430 and abuts against bottom ends 3420 of the protruding bars 342. A through hole 344 communicating with the opening 340 is transversely defined in a center portion of one of the outer walls 345 of the guiding member 34. A second compression spring 346 extends through the through hole 344 and is supported by the outer wall 345 defining the through hole 344. The insertion portion 325 of the brace 32 inserted into the opening 340 abuts against an inner end of the second compression spring 346 adjacent to the elongated opening 340.

Figure 7:
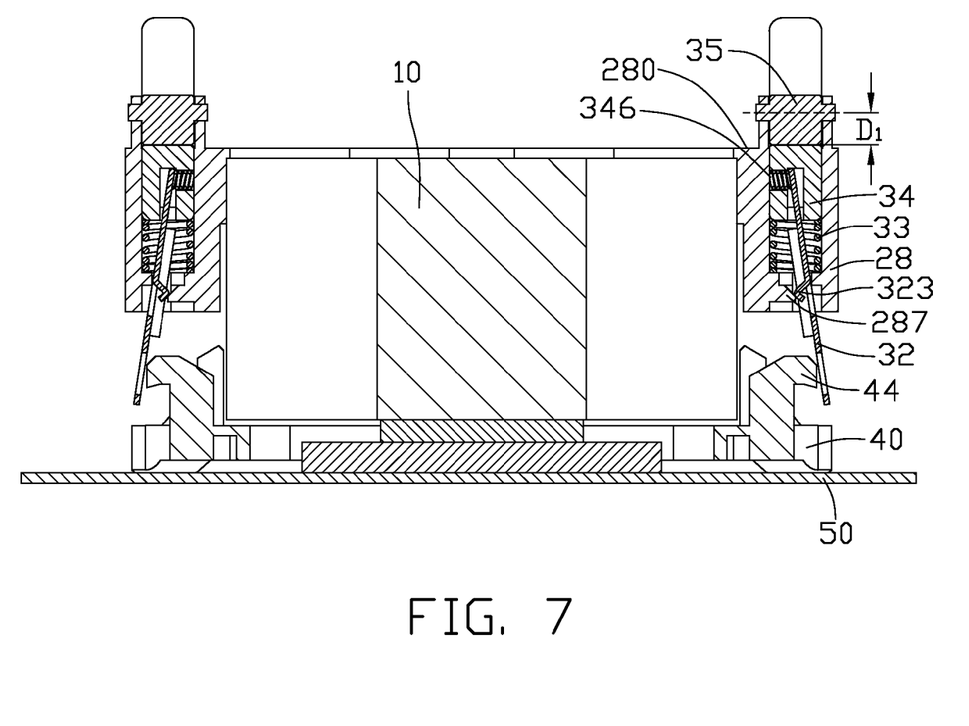
FIG. 7 is a cross-sectional view taken along line VII-VII of FIG. 5 with the clip in an unlocked position.
Figure 8:
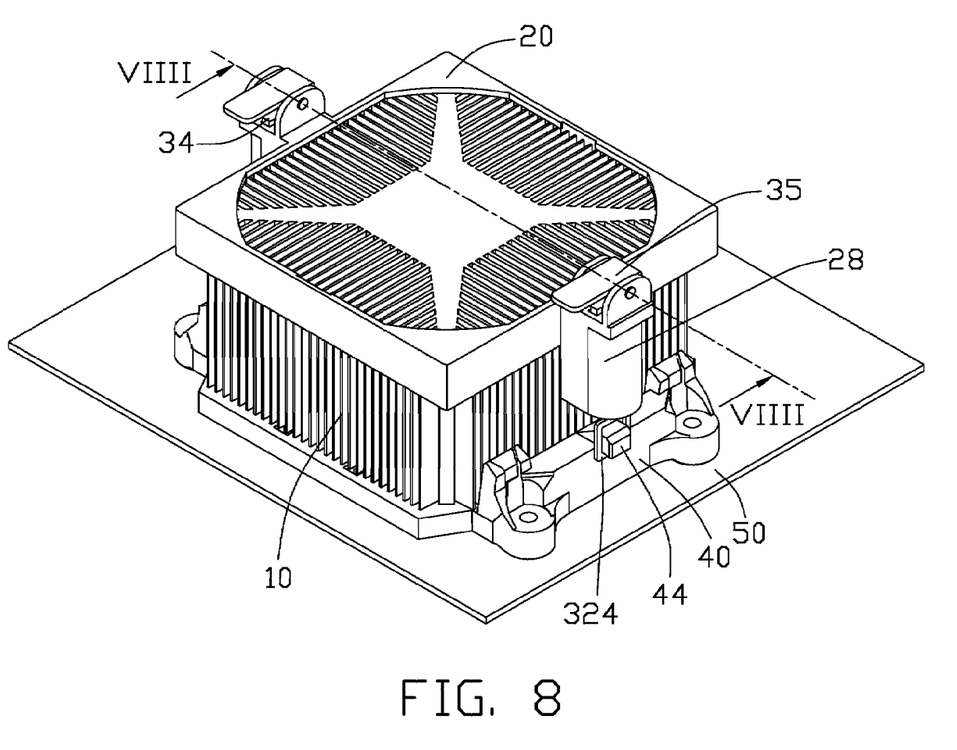
FIG. 8 is an assembled view of FIG. 1 with the clip in a locked position.
Figure 9:
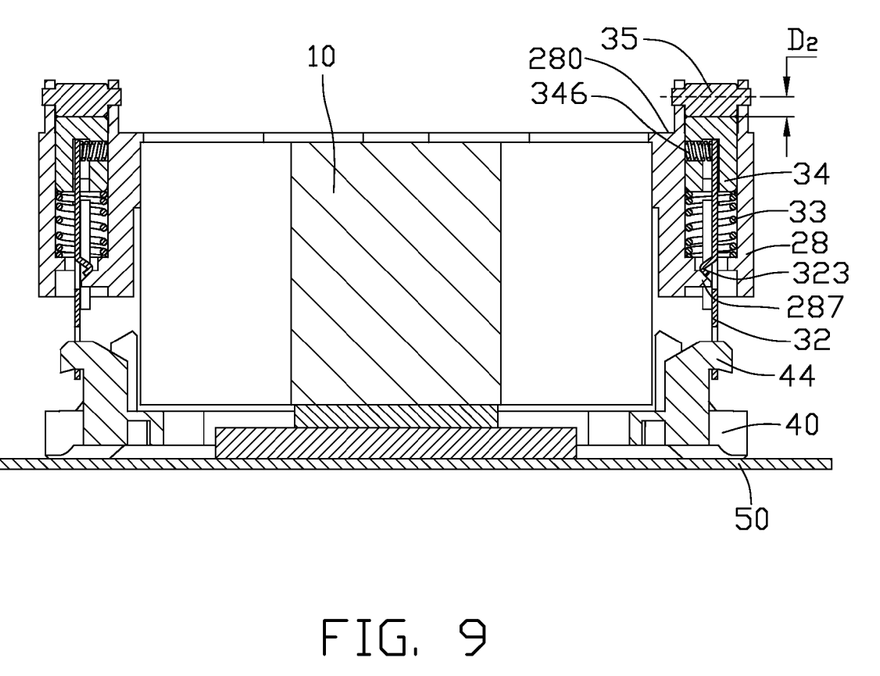
FIG. 9 is a cross-sectional view taken along line VIII-VIII of FIG. 8 with the clip in the locked position.

Referring to FIG. 1 again, the operating member 35 of the clip 30 comprises an eccentric connecting body 350 for being mounted between the two ears 284 of the sleeve 28 of the holder 20, and a handle 352 extending vertically and upwardly from a side of an upper end of the connecting body 350 to facilitate operation of the operating member 35. The eccentric connecting body 350 is used for abutting against the top portion 341 of the guiding member 34. A retaining face 3501 is formed at an outer face of the eccentric connecting body 350. A pair of pivots 354 are formed at lateral sides of the connecting body 350 for being inserted into the mounting holes 2840 of the ears 284 to mount the operating member 35 between the two ears 284 of the sleeve 28 of the holder 20. The operating member 35 can rotate around the pivots 354 relative to the sleeve 28 of the holder 20 between an open and a closed position. When the operating member 35 is in the open position, the handle 352 is upright (shown in FIG. 7), there is a distance D1 between the pivots 354 and the top portion 341 of the guiding member 34. In the open position, the retaining face 3501 of the operating member 35 is substantially perpendicular to the top portion 341 of the guiding member 34. When the operating member 35 is in the closed position, the handle 352 rotates 90° relative to the sleeve 28 in an anti-clockwise. At closed position, the handle 352 is in a horizontal state and the retaining face 3501 of the operating member 35 contacts with the top portion 341 of the guiding member 34 and there is a distance D2 (shown in FIG. 9) between the pivots 354 and the top portion 341 of the guiding member 34. The distance D2 is smaller than the distance D1.

Referring to FIGS. 5-9, in assembly of the invention, the heat sink 10 is received in the retention module 40 and contact with the CPU 52 mounted on the printed circuit board 50. The tongues 25 of the holder 20 are engaged in the corresponding recesses 120 of the heat sink 10 to mount the holder 20 onto the heat sink 10. After the brace 32 with the first compression spring 33 thereon is assembled in the guiding member 34, the combination of the brace 32 and the guiding member 34 extends through the through hole 281 of the sleeve 28 of the holder 20 along a top-to-bottom direction. The pivots 354 of each operating member 35 are inserted into the mounting holes 2840 of the ears 284 of the sleeve 28 to mount the operating member 35 on the sleeve 28. In this state, the handle 352 of the operating member 35 is upright. During the mounting of the operating member 35, the guiding member 34 is pressed by the operating member 35 and totally received in the through hole 281 and the top portion 341 of the guiding member 34 are aligned with the top plate 280 of the sleeve 28. The bottom ends 3420 of the bars 342 of the guiding member 34 are received in the slots 283 of the sleeve 28 and abuts against the steps 2830 in the sleeve 28 of the holder 20. The transverse baffle portion 321 of the brace 32 is received in the groove 3430 and abuts against the bottom ends 3420 of the protruding bars 342. Two free ends of the transverse baffle portion 321 of the brace 32 are received in the splits 285 in the sleeve 28. The first compression spring 33 is compressed between the baffle portion 321 of the brace 32 and the annular pad 286 in the sleeve 28 of the holder 20. A bottom end of the first compression spring 33 abuts against the annular pad 286. The bulge 287 protrudes from the annular pad 286. The tab 323 on the brace 32 engages with a lower portion (not labeled) of the inclined surface 2870 of the bulge 287; simultaneously, a portion of the brace 32 corresponding to the tab 323 abuts against the annular pad 286, thus deflecting the brace 32 from the vertical direction and allowing the insertion portion 321 of the brace 32 to compress the second compression spring 346. In this state, the first and second compression springs 33, 346 are both compressed. The fastening portion 324 of the brace 32 is located beyond the block 44 of the retention module 40. Particularly referring to FIGS. 8-9, the handle 352 of the operating member 35 is pressed from the open position to the closed position. The handle 352 is horizontal and the retaining face 3501 of the operating member 35 contacts with the top portion 341 of the guiding member 34. Due to the distance D2 being smaller than the distance D1, the first compression spring 33 is stretched a distance, wherein the distance is substantially equal to the difference between the distance D1 and D2; and the guiding member 34 is pushed upwardly by the first compression spring 33, whereby the top portion 341 is pushed above the top plate 280 of the sleeve 28 of the holder 20. The brace 32 is driven to move upwardly with the guiding member 34. During the upward movement of the brace 32, the tab 323 of the brace 32 moves to engage an upper portion (not labeled) of the inclined surface 2870 of the bulge 287 and the second compression spring 346 expands to push the insertion portion 325 of the brace 32 whereby the fastening portion 324 of the brace 32 is driven to move towards the block 44 of the retention module 40 and snappingly engage with the block 44. Disassembly is simply the reverse of assembly.

In this present invention, due to the provision of the cam configuration of the operating members 35 of the clips 30, the tabs 323 of the braces 32 of the clips 30 can move along the bulges 287 of the holder 20 slantwise downwardly/upwardly only when the operating members 35 are driven to be open or closed. Thus, the heat sink 10 can be easily assembled to the printed circuit board 50 or disassembled from the printed circuit board 50 only by operating the operating members 35 of the clips 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a retention module comprising a plurality of sidewalls having a pair of opposite lateral sidewalls, a heat-generating electronic component received in the retention module and surrounded by the sidewalls, a pair of opposite fixture blocks being formed on the opposite lateral sidewalls of the retention module;
   a heat sink attached on the heat-generating electronic component in the retention module;
   a holder mounted on the heat sink and having a pair of protective hollow sleeves at two opposite lateral sides of the holder, the hollow sleeves being positioned correspondingly to the fixture blocks of the retention module, each of the sleeves having a supporting pad therein; and
   a pair of clips securing the heat sink to the retention module, each of the clips comprising a brace extending through each of the sleeves, the brace having a baffle portion located above the supporting pad of each of the sleeves and a fastening portion below a bottom end of each of the sleeves, a first spring compressed between the baffle portion of the brace and the pad of each of the sleeves;
   wherein the fastening portion of each of the clips securely fastens each of the fixture blocks of the retention module after the first spring is stretched a distance with an upward movement of the brace of each of the clips.

2. The heat dissipation device as claimed in claim 1, wherein a bulge is formed on the pad of the sleeve and a tab is formed on the brace, wherein when the first spring is compressed, a lower portion of the bulge of the sleeve engages with the tab of the brace, and an upper portion of the bulge of the sleeve engages with the tab of the brace after the first spring is stretched a distance.

3. The heat dissipation device as claimed in claim 1, wherein the first spring is mounted around the brace and sandwiched between the baffle portion and the fastening portion of the brace.

4. The heat dissipation device as claimed in claim 1, wherein each of the clips furhter comprises an operating member located above the baffle portion of the brace, and the first spring is released after the operating member is operated from a vertical orientation to a horizontal orientation.

5. The heat dissipation device as claimed in claim 4, wherein the brace comprises a post, the baffle portion being transversely formed on the post, with an insertion portion formed on a top of the post and the fastening portion formed a bottom end of the post, wherein the first spring is mounted around the post.

6. The heat dissipation device as claimed in claim 5, wherein each of the clips furhter comprises a guiding member received in the sleeve and sandwiched between the operating member and the baffle portion of the brace, wherein the insertion portion of the brace is inserted into the guiding member.

7. The heat dissipation device as claimed in claim 6, wherein a second spring is received in the guiding member and the insertion portion of the brace abuts against the compression spring.

8. The heat dissipation device as claimed in claim 1, wherein the holder comprises a mounting plate pressing downwardly on a top of the heat sink and four sidewalls extending downwardly from the mounting plate surrounding the heat sink.

9. The heat dissipation device as claimed in claim 8, wherein the sleeve comprises a top plate, an outer wall extending downwardly from the top plate and a pair of protruding ears extending upwardly from the top plate, and wherein the operating member is mounted between the two ears.

10. The heat dissipation device as claimed in claim 1, wherein the first spring is a compression spring.

11. A combination used for mounting a heat sink on a printed circuit board, comprising:
   a holder mounted on a top of the heat sink;
   a protective hollow sleeve formed at a lateral side of the holder and having an inner surface and a supporting pad formed on the inner surface near a bottom end of the sleeve;
   a brace extending through the sleeve, the brace comprising a traverse baffle portion above the pad of the sleeve and a fastening portion below a bottom end of the sleeve; and
   a spring compressed between the baffle portion and the pad;
   wherein the fastening portion moves toward the bottom end of the sleeve after the spring is stretched a distance;
   wherein the brace forms a tab and the pad of the sleeve forms a bulge having an inclined surface engaging with tab.

12. The combination as claimed in claim 11, wherein the brace comprise a post with the transverse baffle portion at a top of the post, the fastening portion forming at a bottom end of the post.

13. The combination as claimed in claim 11, wherein the spring is mounted around the post.

14. An electronic combination comprising:
   a printed circuit board having a heat-generating electronic component and a retention module thereon, wherein the retention module surrounds the electronic component and comprises a fixture block;
   a heat sink mounted on the electronic component and thermally connecting therewith;
   a fan holder mounted on the heat sink, adapted for mounting a fan thereon, the fan holder comprising a sleeve with a through hole defined therein, a supporting pad at a bottom end thereof, and a bulge having an inclined surface near the supporting pad, the sleeve being located above the fixture block; and
   a clip comprising a supporting brace having a fastening portion below the supporting pad, a post in the through hole of the sleeve, a tab extending from the post, and a baffle portion above the post, a spring surrounding the post and between the baffled portion and the supporting pad, and an operating member pivotably connected to the sleeve and operably connecting with the brace, wherein when the operating member is pivoted to a first position, the spring is compressed, the tab engages a lower portion of the inclined surface of the bulge, and the fastening portion separates from the fixture block, and when the operating member is pivoted to a second position, the spring is stretched, the tab moves to engage an upper portion of the inclined surface of the bulge, and the fastening portion moves to fasten with the fixture block thereby pushing the heat sink downward toward the electronic component.

15. The electronic combination of claim 14, wherein the operating member is oriented horizontally when the operating member is pivoted to the second position.

16. The electronic combination of claim 14 further comprising a second spring horizontally abutting against the brace, the second spring expanding when the operating member is pivoted to the second position.

17. The electronic combination of claim 14 further comprising a guiding member located between the operating member and the post of the brace, the guiding member moving upwardly when the operating member is moved to the second position.

18. The electronic combination of claim 14, wherein the operating member is oriented vertically when the operating member is pivoted to the first position.

19. The electronic combination of claim 18, wherein the operating member is oriented horizontally when the operating member is pivoted to the second position.

* * * * *